United States Patent [19]

Lusk

[11] 4,413,740
[45] Nov. 8, 1983

[54] ELECTRONIC PACKAGING TECHNIQUE

[75] Inventor: Kenneth P. Lusk, Ridgecrest, Calif.

[73] Assignee: The United of America as represented by the Secreatary of the Navy, Washington, D.C.

[21] Appl. No.: 295,353

[22] Filed: Aug. 24, 1981

[51] Int. Cl.³ .......................... H05K 7/18; H05K 7/20
[52] U.S. Cl. ...................................... 211/26; 211/41; 361/386; 361/420; 361/429
[58] Field of Search .............. 361/380, 386, 388, 392, 361/393, 395, 399, 412, 415, 417, 419, 420, 424, 429; 174/52 R; 211/26, 41

[56] References Cited

U.S. PATENT DOCUMENTS

| 2,976,806 | 3/1961 | Risk et al. | 102/92.5 |
| 3,020,450 | 2/1962 | Shafer | 317/99 |
| 3,029,368 | 4/1962 | Wulc | 317/101 |
| 3,596,140 | 7/1971 | Walsh | 317/101 |
| 3,735,205 | 5/1973 | Friedrich | 361/386 |
| 4,051,414 | 9/1977 | Will et al. | 361/415 |
| 4,201,303 | 5/1980 | Smith | 211/41 |
| 4,353,469 | 10/1982 | Etchison, Jr. | 211/41 |
| 4,371,083 | 2/1983 | Zingrini | 211/26 |

Primary Examiner—G. P. Tolin
Attorney, Agent, or Firm—R. F. Beers; W. Thom Skeer

[57] ABSTRACT

Heat sink segments which are longitudinal sections of metal cylinders support planar circuit elements and are pivotally mounted on bulkheads to gain access to circuit elements.

9 Claims, 3 Drawing Figures

U.S. Patent  Nov. 8, 1983  4,413,740
FIG. 1
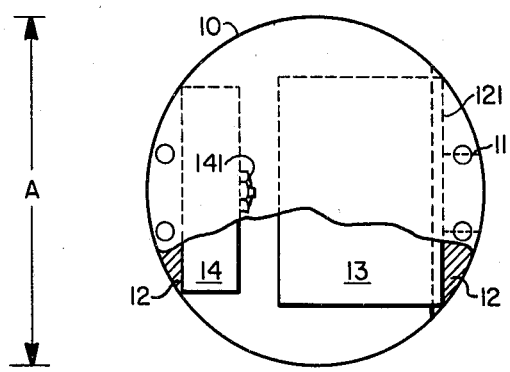
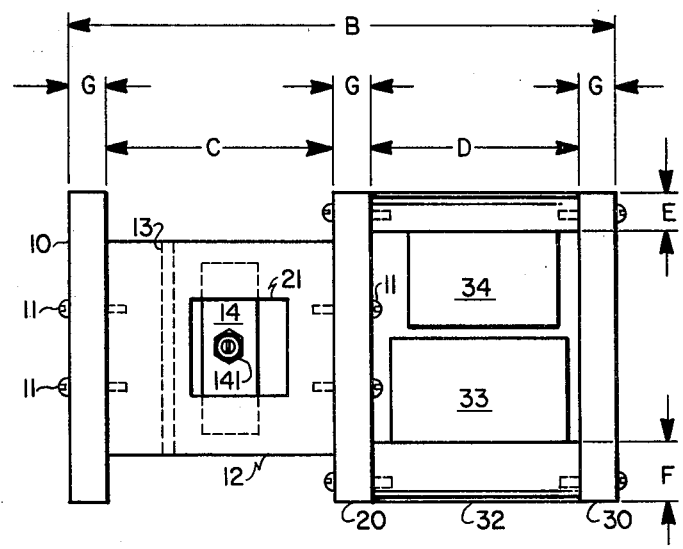
FIG. 2
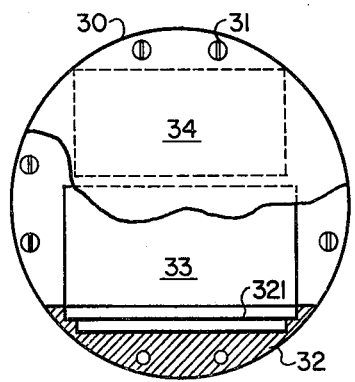
FIG. 3

ELECTRONIC PACKAGING TECHNIQUE

BACKGROUND OF THE INVENTION

1. Field of the Invention

This invention relates to the field of metal fabrication. More particularly, the invention relates to the manufacture of metal chassis supports for electronic equipment. By way of further characterization, the invention relates to a chassis to be fit within a cylindrical environment. By way of illustration, but without limitation thereto, the invention will be described as it pertains to a chassis for the support of electronic hardware in an aerial missile.

2. Description of the Prior Art

The incorporation of electronic circuitry in aerial missiles is relatively well-developed. Generally, there are two common methods used in this art, one utilizes a plurality of circular circuit boards or assemblies which are stacked with spacers between individual circuit boards to form a package having a generally cylindrical shape.

In another arrangement electronic circuit boards of rectangular plan configuration but of varying width are placed in a stacked relationship with spacers such that the width of the board forms a chord of the circular cross sectional area.

Although satisfactory for many purposes, the prior art constructions suffer from electro magnetic and radio frequency interference between individual boards and a difficulty in obtaining adequate heat sinking for heat producing components within limited confines. Additionally, neither of the common prior art constructions afford much torsional rigidity and each poses problems in connection with the mounting in a limited cylindrical space such as the interior of an aerial missile. Further circuit access is difficult with either arrangement.

BRIEF DESCRIPTION OF THE INVENTION

The invention overcomes many of the disadvantages of the prior art by providing spaced bulkheads of light weight metal which support a relative thick metallic convex spacing element upon which the circuitry is mounted on the inner flat surface thereof. By utilizing pairs of elongated connectors to secure the mounting plates to the bulkheads, a hinged arrangement is possible in which circuitry may be inspected or adjusted on a bench mock-up without extensive disassembly of the electronic hardware.

Accordingly, it is an object of this invention to provide an improved electronic chassis.

Another object of this invention is to provide a torsionally rigid chassis suitable for high-vibration environments.

A still further object of the present invention is the provision of a circuit supporting structure which provides for improved shielding.

Another object of the present invention is to provide an electronic chassis which may be substituted in an aerial missile for other components conventionally located therein.

BRIEF DESCRIPTION OF THE DRAWINGS

FIG. 1 is a left elevation of the chassis of the invention partially in cutaway;

FIG. 2 is a side elevation of an exemplary construction according to the invention; and FIG. 3 is a right end elevation of the device of FIGS. 1 and 2.

DESCRIPTION OF THE PREFERRED EMBODIMENT

Referring to FIGS. 1-3 simplified end and side elevation views of the invention are shown illustrating the major components thereof. The major components of the chassis are end bulkheads 10 and 30 and a central or intermediate bulkhead 20. A plurality of concave support plates, illustrated at 12 and 32, are attached to end bulkheads 10 and 30 and intermediate bulkhead 20 to form a rigid cylindrical structure. The attachments of the support plates are essentially identical and will be described in detail as it pertains to support plates 12. As illustrated, a plurality of fasteners 11 extend through end bulkhead 10 and central bulkhead 20 and enter holes in support plate 12 to provide attachment therefor. Fasteners 11, which may be machine screws or bolts, are arranged such that, by removing opposing pairs, support plate 12 may be hinged downwardly to gain access to components mounted on the flat side thereof. For example, a circuit card 13 is shown as attached to one support plate 12 in a conventional fashion such as to stand off therefrom at right angles. To this end, a groove indicated at 121 has been machined across the flat surface of support plate 12.

If cabling or other wiring considerations make it imperative that support plate 12 be hinged in a preferred manner, the fasteners 11 that do not serve as the hinge in that operational mode may be off-set such that if the wrong pair of hinge fasteners 11 are inadvertently removed, no hinging motion is possible, thereby saving the wiring and mounted components from accidental damage. Of course, conventional techniques of marking bolts such as using bolts or screws made of different material or differently colored screw heads may be used to index the desired operational parameter.

If desired, access to mounted components may be made by means of ports machined in supporting plates 12. As an example of such an arrangement a containerized circuit 14 having an adjusting screw 141 is shown as mounted on the flat surface of the left most plate 12 as seen in FIG. 1, the opposing support plate 12 has a port 21 machined, or otherwise formed, such as to extend through from the flat to the convex faces thereof such that when the circuit is assembled adjustment 141 may be accessed from the other side of the circuit arrangement.

As previously noted, the flat surfaces of support plates 12 or 32 may be machined to receive particular circuit components. Another fashion of accomplishing this is indicated at FIG. 3. In FIG. 3 it will be observed that support plate 32 has a stepped well 321 machined therein such that a containerized circuit component, indicated generally at 33, may be supported about the periphery thereof to assure positive mounting.

The length of support plates 12 and 32, indicated at dimensions C and D respectively, together with the thicknesses of end supports 10, 20, and 30, indicated at dimensions G, may be chosen such that the overall length, dimension B, will compactly fit within the interior of the cylindrical space allowed within the missile or air frame where such circuit is to be employed. Similarly, the thickness of support plates, indicated at dimensions E and F, may be varied to provide the desired clearances and heat sink capacities as anticipated to be useful in the actual environment. For example, if circuit dimensions permit, the thicknesses E and F may be made such that the ends of the flat surfaces of spacing plates 12 may overlap the surface of spacing plates 32 on either side of central bulkhead 20 such that rigidity of the assembly is improved. Additionally the dimensions may be selected to avoid mechanical resonance at undesired frequencies.

Various materials may be used to fabricate the chassis of the invention in accordance with good design practice. For example, industrial grades of aluminum and brass have been employed effectively. It should also be noted that the mounting of the circuit components may cooperate with the placement of bulkheads 10, 20, and 30 as well as support plates 12 and 32 such that radio frequency and magnetic shielding is improved. For example, conventional feed-through capacitors and filters may be employed to make electrical connections between components mounted on spacing plates 12 and those mounted on spacing plates 32. The desirability and installation of such hardware is within the purview of those skilled in the art and its selection and application depends, to a large measure, on the circuit configurations mounted on the chassis of the invention.

The foregoing description taken together with the appended claims constitute a disclosure such as to enable a person skilled in the electronics and metal fabrication arts and having the benefit of the teachings contained therein to make and use the invention. Further, the structure herein described meets the aforestated objects of invention, and generally constitutes a meritorious advance in the art unobvious to such a worker not having the benefit of these teachings.

What is claimed is:

1. An electronic chassis for mounting circuitry within a cylindrical volume comprising:
    a plurality of circular bulkheads having radii corresponding to the inner radius of said cylindrical volume;
    a plurality of support plates placed between adjacent ones of said circular bulkheads to define a plurality of longitudinally aligned circuit confining volumes separated by said circular supports, each support plate having a planar side for the support of electronic components, and a convex arcuate side for alignment with the circumference of said circular bulkhead;
    a pair of elongated cylindrical fasteners extending from each end of each support plate and passing through said circular bulkheads, the longitudinal axes of corresponding ones of each pair being aligned to permit hinging movement thereabout upon removal of the other fastener of each pair; and
    the support plates of each circuit confining volume being circumferentially displaced with respect to those of adjacent volumes.

2. An electronic chassis according to claim 1 wherein said support plates are made of light weight metal.

3. An electronic chassis according to claim 1 wherein said support plates have at least one transversely extending groove to permit mounting electrical components thereon.

4. An electronic chassis according to claim 1 in which said support plates are dimensioned to cooperate with said circular bulkheads and each other to increase the natural resonant frequency of the assembly and the bending moment thereof.

5. An electronic chassis according to claim 3 in which said support plates are dimensioned to cooperate with said circular bulkheads and each other to increase the natural resonant frequency of the assembly and the bending moment thereof.

6. An electronic chassis according to claim 5 wherein said circular bulkheads and said support plates are made of an alloy of aluminum.

7. An electronic chassis according to claim 6 wherein said support plates have voids extending from the convex to the planar sides thereof to permit access to components mounted thereon.

8. An electronic chassis according to claim 7 wherein the aforesaid elongated fasteners are machine bolts extending through the circular bulkheads into the ends of said support plates.

9. An electronic chassis according to claim 8 wherein said support plates have a milled recess in the planar face thereof to support the periphery of electronic components mounted thereon.

* * * * *